US011410353B2

(12) United States Patent
Helle et al.

(10) Patent No.: US 11,410,353 B2
(45) Date of Patent: Aug. 9, 2022

(54) COMBINATION OF TEMPORALLY RESOLVED ANGIOGRAPHIC IMAGES WITH A SPATIALLY RESOLVED ANGIOGRAPHIC IMAGE

(71) Applicant: KONINKLIJKE PHILIPS N.V., Eindhoven (NL)

(72) Inventors: Michael Gunter Helle, Hamburg (DE); Thomas Lindner, Kiel (DE)

(73) Assignee: Koninklijke Philips N.V., Eindhoven (NL)

( * ) Notice: Subject to any disclaimer, the term of this patent is extended or adjusted under 35 U.S.C. 154(b) by 134 days.

(21) Appl. No.: 16/767,613

(22) PCT Filed: Nov. 29, 2018

(86) PCT No.: PCT/EP2018/083060
§ 371 (c)(1),
(2) Date: May 28, 2020

(87) PCT Pub. No.: WO2019/106113
PCT Pub. Date: Jun. 6, 2019

(65) Prior Publication Data
US 2020/0294286 A1    Sep. 17, 2020

(30) Foreign Application Priority Data

Nov. 29, 2017   (EP) .................................... 17204271

(51) Int. Cl.
*G06T 11/00*   (2006.01)
*G01R 33/48*   (2006.01)
(Continued)

(52) U.S. Cl.
CPC ........ *G06T 11/008* (2013.01); *G01R 33/4812* (2013.01); *G01R 33/5608* (2013.01);
(Continued)

(58) Field of Classification Search
CPC ..... G06T 11/008; G06T 7/0012; G06T 15/08; G06T 2207/10088; G06T 2207/30016;
(Continued)

(56) References Cited

U.S. PATENT DOCUMENTS 7,689,267 B2 *  3/2010  Prince .................... A61B 5/411
                                                324/309
9,712,738 B2 *  7/2017  Van Heugten ... H04N 5/232125
(Continued)

OTHER PUBLICATIONS

Bernstein et al "Handbook of MRI Pulse Sequences" p. 802-829 (2004).
(Continued)

*Primary Examiner* — Shefali D Goradia

(57) ABSTRACT

The invention provides for a medical imaging system (100, 300) comprising a processor (106) for controlling the medical imaging system. Execution of machine executable instructions (112) causes the processor to receive (200) a static angiographic image (114) of a region of interest (322), receive (202) a time series of angiographic images (116, 116') of the region of interest, construct (204) an image mask (118) using the static angiographic image, determine (206) a time dependent signal (120) for each voxel within the image mask using the time series of angiographic images, construct (208) a composite angiographic image by: assigning (210) a fill time (126) to each voxel within the image mask using an extremum (124) of the time dependent signal if the extremum deviates from an average of the time dependent signal more than a predetermined threshold, and identifying (212) voxels within the image mask as being unfilled voxels.

15 Claims, 9 Drawing Sheets

(51) Int. Cl.
*G01R 33/56* (2006.01)
*G01R 33/563* (2006.01)
*G06T 7/00* (2017.01)
*G06T 15/08* (2011.01)

(52) U.S. Cl.
CPC ........ *G01R 33/5635* (2013.01); *G06T 7/0012* (2013.01); *G06T 15/08* (2013.01); *G06T 2207/10088* (2013.01); *G06T 2207/30016* (2013.01); *G06T 2207/30104* (2013.01); *G06T 2211/404* (2013.01)

(58) Field of Classification Search
CPC .... G06T 2207/30104; G06T 2211/404; G01R 33/4812; G01R 33/5608; G01R 33/5635
See application file for complete search history.

(56) References Cited

U.S. PATENT DOCUMENTS 11,089,970 B2 * 8/2021 Lindner ............. G01R 33/5635
2016/0135775 A1 * 5/2016 Mistretta ............... G06T 7/0012
600/419

OTHER PUBLICATIONS

International Search Report and Written Opinion from PCT/EP2018/083060 dated Jan. 18, 2019.
Nils Daniel Forkert et al: "4D blood flow visualization fusing 3D and 4D MRA image sequences", Journal of Magnetic Resonance Imaging, vol. 36, No. 2, Aug. 1, 2012 (Aug. 1, 2012), pp. 443-453.
Mazaheri Yousef et al: "Combined time-resolved and high-spatial-resolution 3D MRA using an extended adaptive acquisition", Journal of Magnetic Resonance Imaging, Society for Magnetic Resonance Maging, Oak Brook, IL, US, vol. 15, No. 3, Mar. 1, 2002 (Mar. 1, 2002), pp. 291-301.
Jensen-Kondering Ulf et al:"Superselective pseudo-continuous arterial spin labeling angiography", European Journal of Radiology, Elsevier Science, NL,vol. 84, No. 9, Jun. 22, 2015 (Jun. 22, 2015), pp. 1758-1767.
Robben et al "Intra Patient Non-Rigid Registration of 3D Vascular Cerebral Images" Clinical Image Based Procedures International Workshop Oct. 2012.
Bernstein et al "Handbook of MRI Pulse Sequences" p. 678-701 (2004).

* cited by examiner

COMBINATION OF TEMPORALLY RESOLVED ANGIOGRAPHIC IMAGES WITH A SPATIALLY RESOLVED ANGIOGRAPHIC IMAGE

CROSS REFERENCE TO RELATED APPLICATIONS

This application is a U.S. national phase application of International Application No. PCT/EP2018/083060 filed on Nov. 29, 2018, which claims the benefit of EP Application Serial No. 17204271.5 filed on Nov. 29, 2017 and is incorporated herein by reference.

FIELD THE INVENTION

The invention relates to angiographic medical imaging techniques, in particular to the magnetic resonance imaging techniques of arterial spin labeling and time of flight angiography.

BACKGROUND OF THE INVENTION

MRI scanners are able to construct images of either slices or volumes. A slice is a thin volume that is only one voxel thick. A voxel is a small volume element over which the MR signal is averaged, and represents the resolution of the MR image. A voxel may also be referred to as a pixel (picture element) herein if a single slice is considered.

By performing different magnetic resonance imaging protocols (which are implemented as pulse sequences or pulse sequence commands), different types of information can be measured about a subject. For example, there are various techniques, which enable the encoding of spins such that the flow or diffusion of fluid can be directly measured. The reference book "Handbook of MRI Pulse Sequences" (hereafter "Handbook of MRI Pulse Sequences") by Bernstein et. al., Elsevier, 2004, ISBN 978-0-12-092861-3 describes in section 17.1 (pp. 802 through 829) provides a review of several different arterial spin tagging techniques. Arterial Spin Lagging (ASL) is another name for arterial spin tagging. This reference also reviews in section 15.3 (pp. 678 to 701) the Time-Of-Flight (TOF) and the contrast-enhanced MR angiography (CERMA) vascular imaging methods.

SUMMARY OF THE INVENTION

The invention provides for a medical imaging system, a computer program product, and a method of medical imaging.

There exist various medical imaging techniques for generating angiographic images. Some techniques are able to provide angiographic images of higher spatial resolution and some techniques are able to provide angiographic images of higher temporal resolution. Embodiments of the invention may provide a means for combining a static angiographic image which provides spatial angiographic information with a time series of angiographic images that provides temporal angiographic information into a composite angiographic image that contains both the spatial angiographic data and temporal angiographic data. This may be achieved by constructing an image mask from the static angiographic image. The image mask may identify voxels image the vascular structure of a subject. Then the time series of angiographic images is used to construct a time dependent signal for each voxel within the image mask. The time dependent signal for voxels within the image mask can then be examined to determine if and when the voxel is filled during the time period imaged by the time series of angiographic images.

In other examples the time dependent signal for voxels outside of the image mask can also be determined and analyzed to identify anomalous flow outside of the voxels identified in the image mask.

In one aspect the invention provides for a medical imaging system that comprises a memory storing machine-executable instructions. The medical imaging system further comprises a processor for controlling the medical imaging system. Execution of the machine-executable instructions cause the processor to receive a static angiographic image of a region of interest. The region of interest comprises voxels. A static angiographic image as used herein encompasses an image that has been acquired using an angiographic imaging technique or imaging modality. A region of interest as used herein encompasses a three-dimensional region that is imaged by the static angiographic image. The region of interest may be a three-dimensional volume or a two-dimensional slab which has a thickness represented by the thickness of the voxels.

Execution of the machine-executable instructions further causes the processor to receive a time series of angiographic images of the region of interest. The time series of angiographic images may be angiographic images that are acquired at a regular interval or period and which may be used to provide an animation or time evolution. Execution of the machine-executable instructions further causes the processor to construct an image mask using the static angiographic image. The image mask is an identification of voxels within the region of interest. The image mask may for instance be used to indicate regions within the region of interest that contain a vascular structure. The construction of the image mask may be performed differently in the various examples. For example the static angiographic image could be thresholded and voxels which have a value above or below a chosen threshold may be identified as being within the image mask. There may also be more complicated techniques that may be used. There may for example be a vessel tracking or segmentation algorithm that is applied. Anatomical landmarks may be used to identify gross or large vessel structures. Then, vessels adjacent to these known structures may be identified as part of the vessel structure.

Execution of the machine-executable instructions further causes the processor to determine a time dependent signal for each voxel within the image mask using the time series of angiographic images. For example for each of the voxels within the angiographic images there may be one or more values assigned to the voxel. The time dependent signal may be a series of values which represent the value of a particular voxel within the time series of angiographic images.

Execution of the machine-executable instructions further cause the processor to construct a composite angiographic image. The construction of the angiographic image may be performed in several steps. Firstly, a fill time may be assigned to each voxel within the image mask using an extremum of the time dependent signal if the extremum deviates from an average of the time dependent signal more than a predetermined threshold. The average may be an average within a particular voxel, a group of voxels, or a global voxel average. The group of voxels could be for example a group of voxels within the entire mask or within a neighborhood of the voxel being examined.

The construction of the composite angiographic image may be further performed by identifying voxels of an image mask as being unfilled voxels if the extremum deviates from the average of the time dependent signal less than a predetermined threshold. For example the time dependent signal in each voxel can be averaged or assigned some statistical value. The time dependent signal in each voxel can then be searched to see if there is an extremum that is either larger or smaller than the others. If this extremum is outside of a predetermined threshold which could for example be a percent or absolute value above the average, then this voxel can be identified as being a fill time or as an unfilled voxel. For example there may be vascular structures identified by the image mask which are not filled during the time for which the time series of angiographic images were acquired.

This embodiment may be beneficial because it may enable the combination of different angiographic images to provide advantages of both. For example the static angiographic image may have been acquired such that it contains greater detail of the vascular structure of a subject. The time series angiographic data may for example be acquired very rapidly so that it is able to show the time evolution of a signal. The time series of angiographic images are then used to transfer the signal measured into the static angiographic image.

In another embodiment, the static angiographic image is a TOF or time of flight magnetic resonance angiographic image. The time series of angiographic images is a time series of arterial spin labeling magnetic resonance angiographic images. This embodiment may be beneficial because it is able to combine the detailed vascular structure of the TOF magnetic resonance angiographic image with the time evolution of the arterial spin labeling magnetic resonance angiographic images.

In another embodiment, execution of the machine-executable instructions further causes the processor to provide the static angiographic image by reconstructing the static angiographic image from TOF magnetic resonance data. Execution of the machine-executable instructions further causes the processor to provide the time series of angiographic images by reconstructing the time series of angiographic images from ASL magnetic resonance data.

In another embodiment, the medical imaging system further comprises a magnetic resonance imaging system. The memory further comprises pulse sequence commands configured for controlling the magnetic resonance imaging system to acquire the TOF magnetic resonance data according to a time of flight magnetic resonance angiography protocol. The pulse sequence commands are further configured to control the magnetic resonance imaging system to acquire the ASL magnetic resonance data according to an arterial spin labeling magnetic resonance angiography protocol. Execution of the machine-executable instructions further cause the processor to control the magnetic resonance imaging system with the pulse sequence commands to acquire the TOF magnetic resonance data using the pulse sequence commands. Execution of the machine-executable instructions further causes the processor to acquire the ASL magnetic resonance data by controlling the magnetic resonance imaging system with the pulse sequence commands. This embodiment may be beneficial because the static angiographic image and the time series of angiographic images may be acquired when the subject is in the magnetic resonance imaging system. This may mean that the data may be acquired such that the subject is in the same or similar position. This may reduce the amount of registration that needs to be performed and also the data may be more consistent.

The pulse sequence commands could also be configured for acquiring the TOF magnetic resonance data and the ASL magnetic resonance data in an interleaved fashion or even in a sequential fashion.

The ASL protocol could also be a so called continuous protocol. For example the ASL protocol may under sample and acquire portions of the k-space which rotate with respect to each other. This may enable flexible selection of the lines in k-space which are used to reconstruct the time series of angiographic images. In other examples the ASL magnetic resonance data is acquired in fully sampled portions of k-space which are able to be reconstructed into individual images.

In another embodiment, the arterial spin labeling magnetic resonance angiography protocol is a selective arterial spin labeling magnetic resonance angiography protocol. In a selective arterial spin labeling magnetic resonance angiography protocol a particular vein alone may be labeled. This in combination with the method of constructing the composite angiographic image may enable very detailed construction of venous flow from a particular vein.

In another embodiment, the static angiographic image is a magnetic resonance angiographic image.

In another embodiment, the static angiographic image is a CT or computer tomography angiographic image.

In another embodiment, the time series of angiographic images is a time series of magnetic resonance angiographic images.

In another embodiment, the time series of angiographic images is a time series of CT or computer tomography angiographic images.

In another embodiment, execution of the machine-executable instructions further cause the processor to identify an anomalous flow and/or anomalous vascular structure using the composite angiographic image, the static angiographic image, and the time series of angiographic images as input to a trained pattern recognition algorithm. For example the trained pattern recognition algorithm may for example be a neural network or other artificial intelligence algorithm which is able to recognize flow structures which are not due to normal venous or arterial structures. This may be useful in identifying abnormal structures within the subject such as tumors, disease or injuries.

According to embodiments of the invention, the composite angiographic image is rendered such that a measure for the fill time is displayed in the composite angiographic image. The measure for the fill time could for example be the fill time itself, but it could also be a display or highlighting of voxels within the image mask identified as being unfilled voxels or voxels with an otherwise deviating fill time.

In another embodiment, the composite angiographic image is rendered as an animation showing the filling of voxels within the image mask as a function of the fill time.

In another embodiment, the composite angiographic image is rendered as an image with a grayscale, a false color scale or a brightness indicating the fill time of the voxels within the image mask.

The skilled person will understand that many other ways for rendering may be possible for indicating or highlighting voxels with a deviating fill time. This could for example be achieved by means of arrows and/or circles or any other shape indicating those voxels.

In another embodiment, execution of the machine-executable instructions further cause the processor to determine the time dependent signal for each voxel outside of the image mask using the time series of angiographic images. Execution of the machine-executable instructions further cause the processor to identify voxels outside of the image mask as anomalous voxels if the extremum of the time dependent signal deviates from the average of the time dependent signal more than the predetermined threshold. This may be useful in identifying voxels which indicate an anomaly in the subject's structure such as a tumor or injury.

In another embodiment, execution of the machine-executable instructions further cause the processor to mark the anomalous voxels in the composite angiographic image. For example these anomalous voxels may be highlighted or circled or marked with some other indicator that may make it easier for a physician or a technician to notice the anomalous voxels.

In another embodiment, execution of the machine-executable instructions further cause the processor to mark unfilled voxels in the composite angiographic image. For example there may be voxels that are located within the mask but have not been filled. It may be useful to indicate voxels which are part of the vascular structure of the subject that were not filled.

In another embodiment, execution of the machine-executable instructions further cause the processor to register the time series of angiographic images with one another. Execution of the machine-executable instructions may also cause the processor to register the static angiographic image with the time series of angiographic images. Execution of the machine-executable instructions may cause both of these possibilities to happen. This may be useful in dealing with the problem when the subject moves during the acquisition of the time series of angiographic images and/or the static angiographic image. The registration may be performed in different ways. In some instances the vascular structure may be used for the registration. In other cases other anatomical structures and landmarks may be visible within the time series of angiographic images and/or the static angiographic image. For example there may be regions which appear to the eye as being uniform or not containing the anatomic structure, however variations of the contrast may still indicate an anatomical structure.

In another embodiment, the static angiographic image divides a region of interest into a first set of voxels with a first resolution and a first slice thickness. The time series of angiographic images divides the region of interest into a second set of voxels with a second resolution and a second slice thickness. Execution of the machine-executable instructions further causes the processor to interpolate one of the first set of voxels or the second set of voxels such that the first resolution matches the second resolution and the first slice thickness matches the second slice thickness. This may be beneficial because it enables the static angiographic image to be acquired at a different resolution than the time series of angiographic images. For example the resolution of the time series of angiographic images may be lower than the static angiographic image. This for example may enable the time series of angiographic images to be acquired more rapidly. The data acquired from the lower resolution angiographic images is then essentially superimposed on the higher resolution static angiographic image.

In another aspect, the invention provides for a computer program product comprising machine-executable instructions for execution by a processor controlling the medical imaging system. Execution of the machine-executable instructions causes the processor to receive a static angiographic image of a region of interest. The region of interest comprises voxels. Execution of the machine-executable instructions further causes the processor to receive a time series of angiographic images of the region of interest. Execution of the machine-executable instructions further causes the processor to construct an image mask using the static angiographic image. The image mask is an identification of voxels within the region of interest.

Execution of the machine-executable instructions further cause the processor to determine a time dependent signal for each voxel within the image mask using the time series of angiographic images. Execution of the machine-executable instructions further causes the processor to construct a composite angiographic image. The construction of the composite angiographic image may be performed by assigning a fill time to each voxel within the image mask using an extremum of the time dependent signal if the extremum deviates from an average of the time dependent signal more than a predetermined threshold. The construction of the composite angiographic image may further be performed by identifying voxels within the image mask as being unfilled voxels if the extremum deviates from the average of the time dependent signal less than a predetermined threshold. The advantages of this computer program product have been described previously.

In another aspect, the invention provides for a method of medical imaging. The method comprises receiving a static angiographic image of a region of interest. The region of interest comprises voxels. The method further comprises receiving a time series of angiographic images of the region of interest. The method further comprises constructing an image mask using the static angiographic image. The image mask is an identification of voxels within the region of interest. The method further comprises determining a time dependent signal for each voxel within the image mask using the time series of angiographic images. The method further comprises constructing a composite angiographic image. The composite angiographic image may be constructed by assigning a fill time to each voxel in the image mask using an extremum of the time dependent signal if the extremum deviates from an average of the time dependent signal more than a predetermined threshold. The composite angiographic image may be further constructed by identifying voxels within the image mask as being unfilled voxels if the extremum deviates from the average time of the dependent signal less than a predetermined threshold. The advantages of this method have been described previously.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data. TOF magnetic resonance data is an example of magnetic resonance data. ASL magnetic resonance data is a further example of magnetic resonance data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
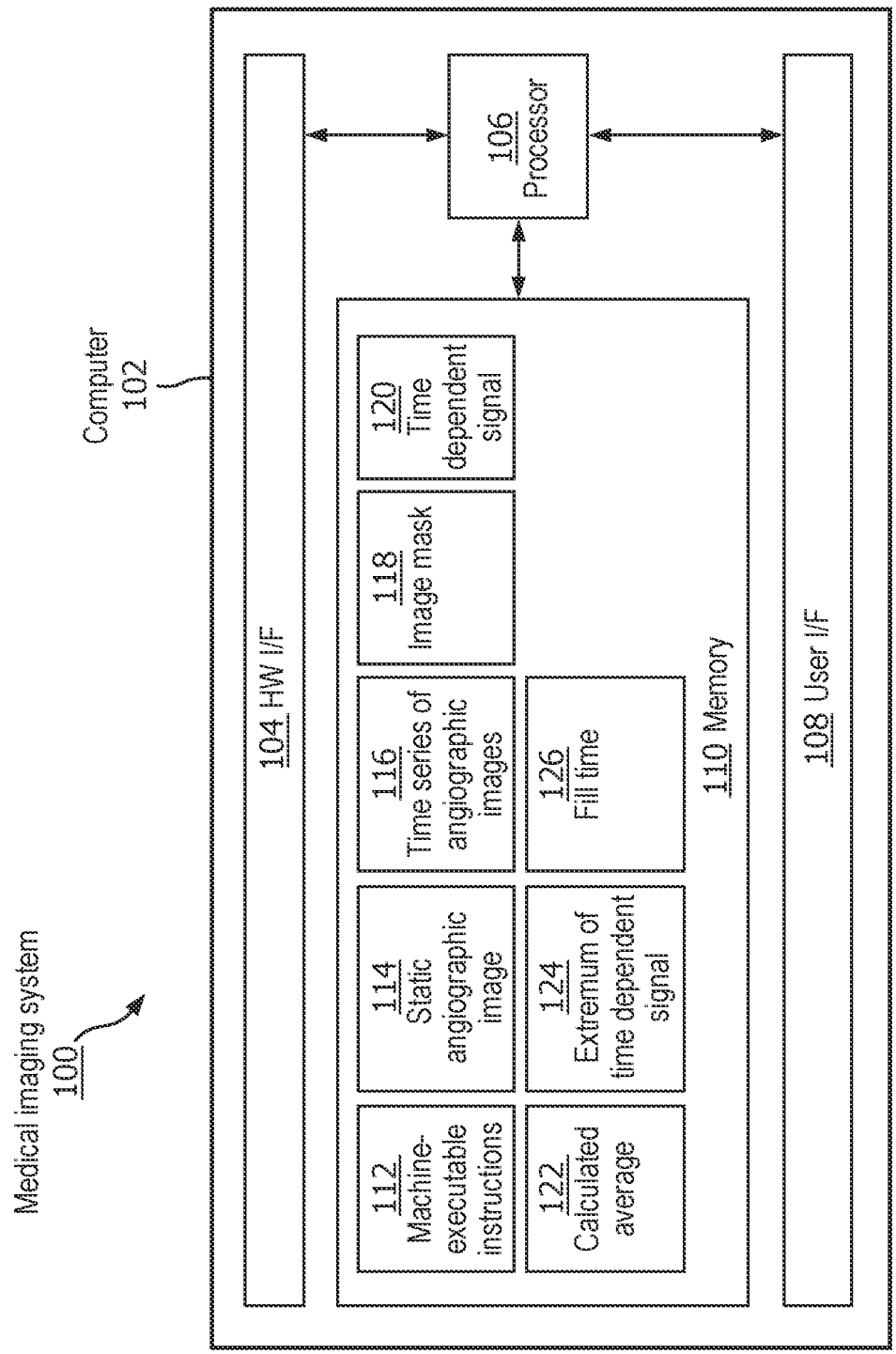
FIG. 1 illustrates an example of a medical imaging system.

FIG. 1 illustrates an example of a medical imaging system 100. The medical imaging system 100 is shown as comprising a computer 102. The computer comprises a processor 106 that is in communication with an optional hardware interface 104, a user interface 108, and a memory 110. The hardware interface 104 may enable the processor 106 to communicate or control other components or to exchange data with other medical imaging or computer systems. The processor 106 may represent one or more processors and/or multiple processor cores. The user interface 108 may include devices for inputting data as well as displaying data. For example the user interface 108 may include a keyboard, mouse, touchscreen. The user interface 108 may also include display or data output devices. The memory 638 (also referred to as computer memory) may be any combination of memory which is accessible to the processor 106. This may include such things as main memory, cached memory, and also non-volatile memory such as flash RAM, hard drives, or other storage devices. In some examples the memory 110 may be considered to be a non-transitory computer-readable medium.

The memory 110 is shown as containing machine-executable instructions 112. The machine-executable instructions 112 enable the processor 106 to control other components via the hardware interface 104 and/or to manipulate data or other files to change and manipulate data such as performing Fourier transforms for other mathematical or data operations.

The memory 110 is further shown as containing a static angiographic image 114. The memory 110 is further shown as containing a time series of angiographic images 116. The memory 110 is shown as containing an image mask 118 that was constructed using the static angiographic image 114. The computer memory 110 is further shown as containing a time dependent signal 120 that was derived for voxels located within the image mask 118 for each of the time series of angiographic images 116. The memory 110 is further shown as containing a calculated average 122 from a voxel. This calculated average 122 may be from a time dependent signal 120 of a particular voxel or voxels within the image mask 118. The memory 110 is further shown as containing an extremum of one of the time dependent signals 120. The extremum of the time dependent signal 124 and the calculated average 122 may be either used for marking a particular voxel within the image mask 118 as having a fill time 126 or being a non-filled voxel in the image mask.

Figure 2:
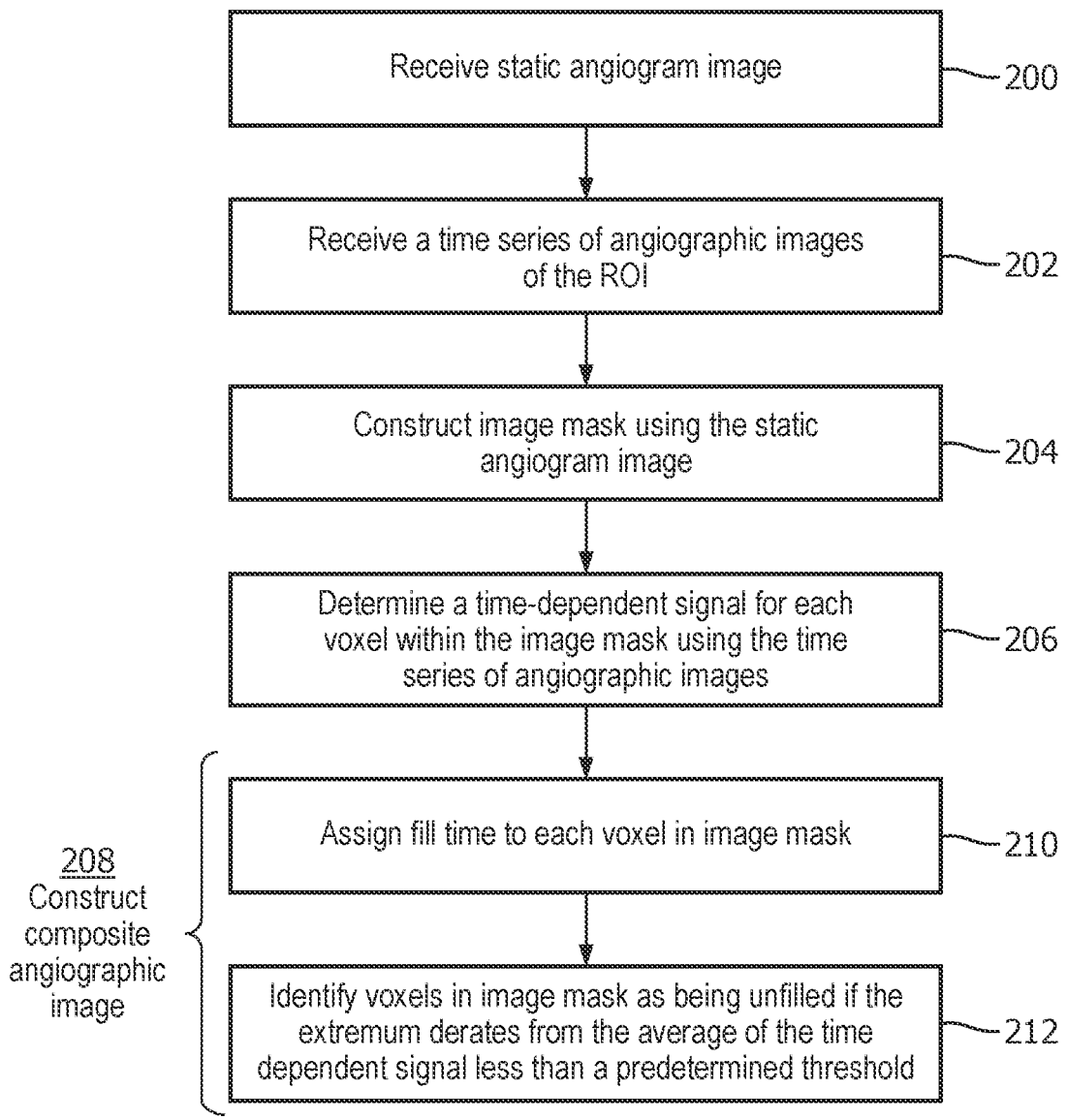
FIG. 2 shows a flow chart which illustrates a method of operating the medical imaging system of FIG. 1.

FIG. 2 shows a flowchart which illustrates a method of operating the medical imaging system 100 of FIG. 1. First in step 200 the static angiographic image 114 is received. The static angiographic image is descriptive of a region of interest of a subject. The region of interest comprises voxels. The static angiographic image may be received in different ways. In some instances the static angiographic image may be received by reconstructing the image from magnetic resonance data. In other instances the static angiographic image may be received via a network connection or other data source.

Next in step 202 a time series of angiographic images of the region of interest is received. As with the static angiographic image the time series of angiographic images may be acquired or received in a variety of ways. Next in step 204 the image mask 118 is constructed using the static angiographic image 114. The image mask is an identification of voxels within the region of interest. Then in step 206 a time dependent signal 120 is determined for each voxel within the image mask using the time series of angiographic images 116. Then finally in step 208 the composite angiographic image 128 is constructed.

The construction of the composite angiographic image 128 is shown as being performed in sub-steps 210 and 212. In step 210 the fill time 126 is assigned to each of the voxels in the image mask using an extremum of the time dependent signal if the extremum deviates from the average 122 of the time dependent signal 120 more than a predetermined threshold. The construction of the composite angiographic image is further performed by identifying voxels within the image mask 118 as being unfilled voxels if the extremum deviates from the average 122 of the time dependent signal less than a predetermined threshold.

Figure 3:
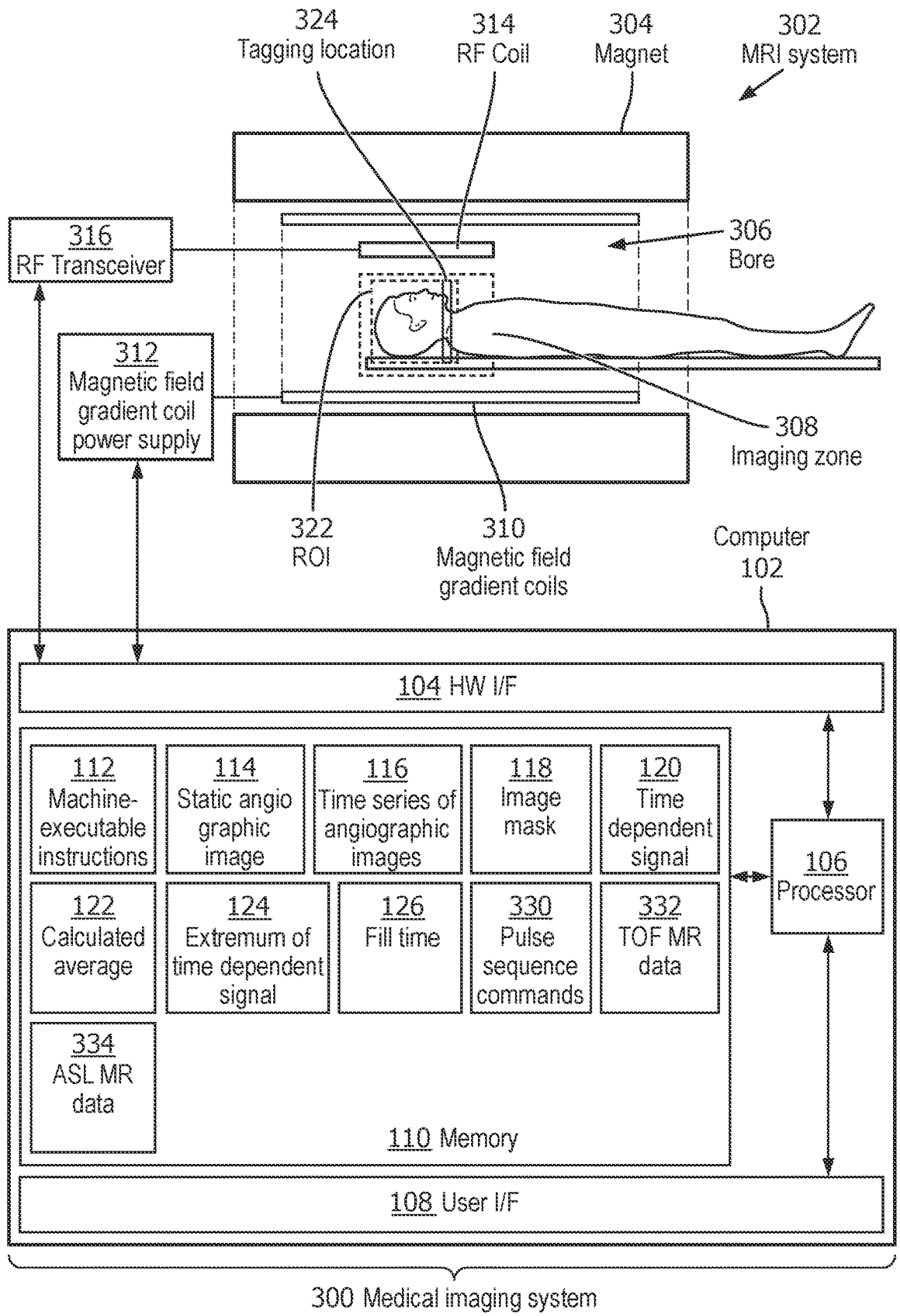
FIG. 3 illustrates a further example of a medical imaging system.

FIG. 3 illustrates a further example of a medical imaging system 300. The medical imaging system 300 is shown as comprising a magnetic resonance imaging system 302. The magnetic resonance imaging system 302 comprises a magnet 304. The magnet 304 is a superconducting cylindrical type magnet 304 with a bore 306 through it. The use of different types of magnets is also possible. Inside the cryostat of the cylindrical magnet, there is a collection of superconducting coils. Within the bore 306 of the cylindrical magnet 304 there is an imaging zone 308 where the magnetic field is strong and uniform enough to perform magnetic resonance imaging.

Within the bore 306 of the magnet there is also a set of magnetic field gradient coils 310 which is used for acquisition of magnetic resonance data to spatially encode magnetic spins within the imaging zone 308 of the magnet 304. The magnetic field gradient coils 310 are connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientation of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receiver. The radio-frequency coil 314 may also have multiple receive/transmit elements and the radio frequency transceiver 316 may have multiple receive/transmit channels.

Within the bore 306 of the magnet 304 there is a subject support 320 which supports the subject in the imaging zone 308. There is a region of interest 322 within the imaging zone 308. Within the region of interest 322 there is also a tagging location 324. The tagging location 324 is a region where a bolus of blood can be labeled either via ASL or TOF magnetic resonance imaging. In this example the tagging location 324 is shown as a plane. This would be used for example for non-selective ASL magnetic resonance imaging. The tagging location 324 could also be localized to a smaller region to perform selective ASL.

The transceiver 316 and the magnetic field gradient coil power supply 312 are shown as being connected to the hardware interface 104 of computer system 102. The computer memory 110 is further shown as containing pulse sequence commands 330. Pulse sequence commands as used herein encompass commands or a timing diagram which may be converted into commands which are used to control the functions of the magnetic resonance imaging system 600 as a function of time. Pulse sequence commands are the implementation of the magnetic resonance imaging protocol applied to a particular magnetic resonance imaging system 600.

The computer memory 110 is further shown as containing TOF magnetic resonance data 332 that was acquired by controlling the magnetic resonance imaging system 302 with the pulse sequence commands 330. The memory 110 is further shown as containing ASL magnetic resonance data 334 that was acquired by controlling the magnetic resonance imaging system 302 with the pulse sequence commands 330 also. In this example the static angiographic image 114 is a TOF magnetic resonance angiographic image. The time series of angiographic images 116 is a time series of arterial spin labeling magnetic resonance angiographic images.

Figure 4:
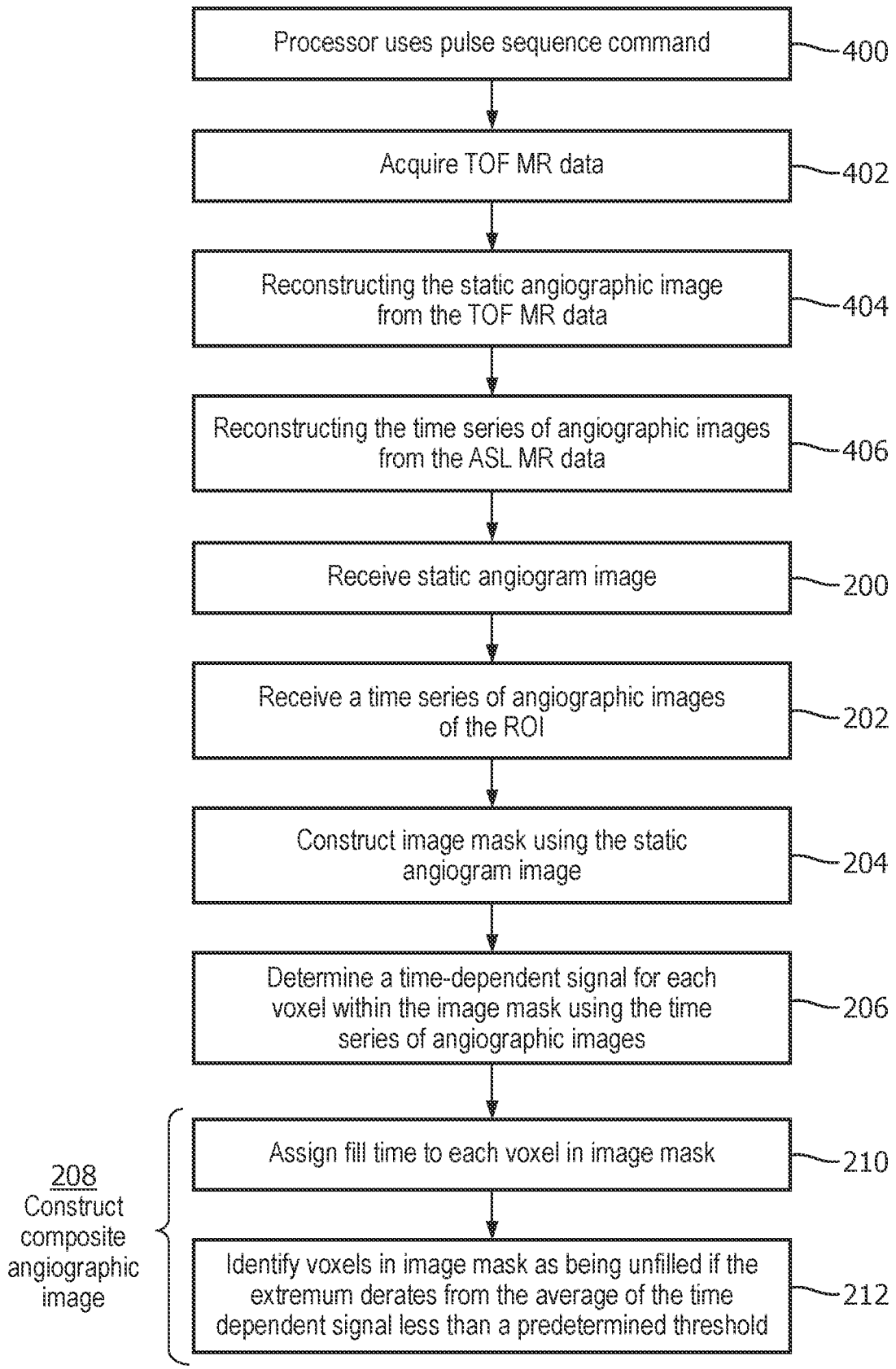
FIG. 4 shows a flow chart which illustrates a method of operating the medical imaging system of FIG. 3.

FIG. 4 shows a flowchart which illustrates a method of operating the medical imaging system 300 of FIG. 3. The method shown in FIG. 4 is similar to that of FIG. 2 with a number of additional steps performed. First in step 400 the processor uses the pulse sequence commands to acquire the TOF magnetic resonance data 332. Next in step 404 the processor 106 uses the pulse sequence commands 330 to control the magnetic resonance imaging system 302 to acquire the ASL magnetic resonance data 334. Steps 400 and 402 may be reversed in order and may also be performed at the same time. For example the pulse sequence commands 330 could be an interleaved pulse sequence commands that acquires the portions of the TOF magnetic resonance data 332 and portions of the ASL magnetic resonance data 334 alternatively in time.

Next, steps 404 and 406 are performed. Steps 404 and 406 may be performed in reverse order. Next in step 404 the static angiographic image 114 is provided by reconstructing the static angiographic image from the TOF magnetic resonance data 332. Next in step 406, the time series of angiographic images 116 is provided by reconstructing the time series of angiographic images 116 from the ASL magnetic resonance data 334. After step 406 the method proceeds to step 200 as is illustrated in FIG. 2.

Examples may provide a method to generate angiographic images of the arterial vasculature with high spatial and temporal resolution by combining information of both, high-resolved TOF acquisitions and temporal-resolved ASL images. The signal of each voxel in both ASL and TOF data is being analyzed simultaneously and conclusions about pathological alterations and technical issues can be drawn. This information can be used to pinpoint the attention of the radiologist to conspicuous features in images in order to avoid overseeing abnormalities, but also to accelerate the diagnostic process.

A detailed visualization of brain feeding arteries and intracranial vessels may be important for the diagnosis of many cerebral diseases, such as stroke, arterio-venous malformations, aneurysms etc.

High spatial resolution may be beneficial because it enables the assessment of the structural morphology of vessels, for instance, to measure the intra-luminar diameter in stenotic arteries or to detect small aneurysms. For an advanced diagnosis, additional information about the hemodynamics is required like blood flow velocity, mean transit time etc.

In MRI, several acquisition techniques are being used to gather sufficient spatial and temporal information about the cerebral vasculature for a complete diagnosis of the vessel architecture and its hemodynamics. Spatial and temporal information are concluded from different sequences which impedes a correct diagnosis of a variety of diseases, especially when the arteries are altered as in AVMs and other pathologies. Thus, combining all information into one image presents relevant information to the radiologist in a concise way for fast and reliable examination of the images. This is not only true for structural images, e.g. T1 and T2 weighted or combining information from different modalities (e.g. CT and MRI) but also for specialized applications, like vascular imaging. As in MRI several techniques exist to acquire images of vascular structures and/or hemodynamic properties, the range of eligible sequences is rather high. Still, despite each method has its individual benefits, there is not one method that can surpass others and give a comprehensive view of the intracranial vascular situation. Moreover, tool would be beneficial that may draw the attention of radiologists to conspicuous features in images in order to avoid overseeing abnormalities, but also to accelerate the diagnostic process.

A combination of image information of different techniques seems attractive to cancel out individual drawbacks while emphasizing the benefits of each technique and thus simplify an evaluation of the data. In addition, this can also be used to automatically (or semi-automatically) pre-analyze the image information and classify certain properties according to the information of each individual sequence. Mismatches of image information that may point to a pathological process or technical issue can be pinpointed and emphasized for the radiologist.

Digital subtraction angiography (DSA) presents the gold standard for angiography regarding spatial and temporal resolution. However, the method only provides projection images of vessels and quantification of hemodynamic parameters is difficult. In addition, the procedure is invasive and a catheter is being placed in the vessel of interest to administer contrast agent. Computed tomography (CT) is less invasive and can generate 3D images of the vasculature, but—as in DSA—the patient is exposed to ionizing radiation and exogenous contrast agent material. Magnetic resonance imaging (MRI) offers a variety of acquisition techniques to visualize vessels. Time-of-flight angiography (TOF) is often used in clinical routine measurements as it can generate angiograms with high spatial resolution, however, no hemodynamic information can be gathered. Time-resolved MR methods usually require gadolinium-based contrast agents and only have limited temporal and spatial resolution. Arterial Spin Labeling (ASL) techniques can create time-resolved angiograms without the usage of contrast agents, but are also limited in spatial resolution in order to reduce the overall acquisition time which impedes the assessment of small vascular structures. The radiologist has to interpret each image series individually and form a complete picture in his mind by gathering all information from the different images. There is no tool available that can analyze the image information and indicate abnormalities prior to the diagnostic process.

Examples may provide for a method that makes it possible to generate angiographic images of the arterial vasculature with high spatial and temporal resolution by combining information of both, high-resolved TOF acquisitions and temporal-resolved ASL images. TOF and ASL images are registered using spatial and temporal information. The signal of each voxel in both ASL and TOF data is being analyzed simultaneously. Thereby, each voxel can be classified according to several properties (explained in more detail below). This information can be used to pinpoint the attention of the radiologist to conspicuous features in images in order to avoid overseeing abnormalities, but also to accelerate the diagnostic process.

Figure 5:
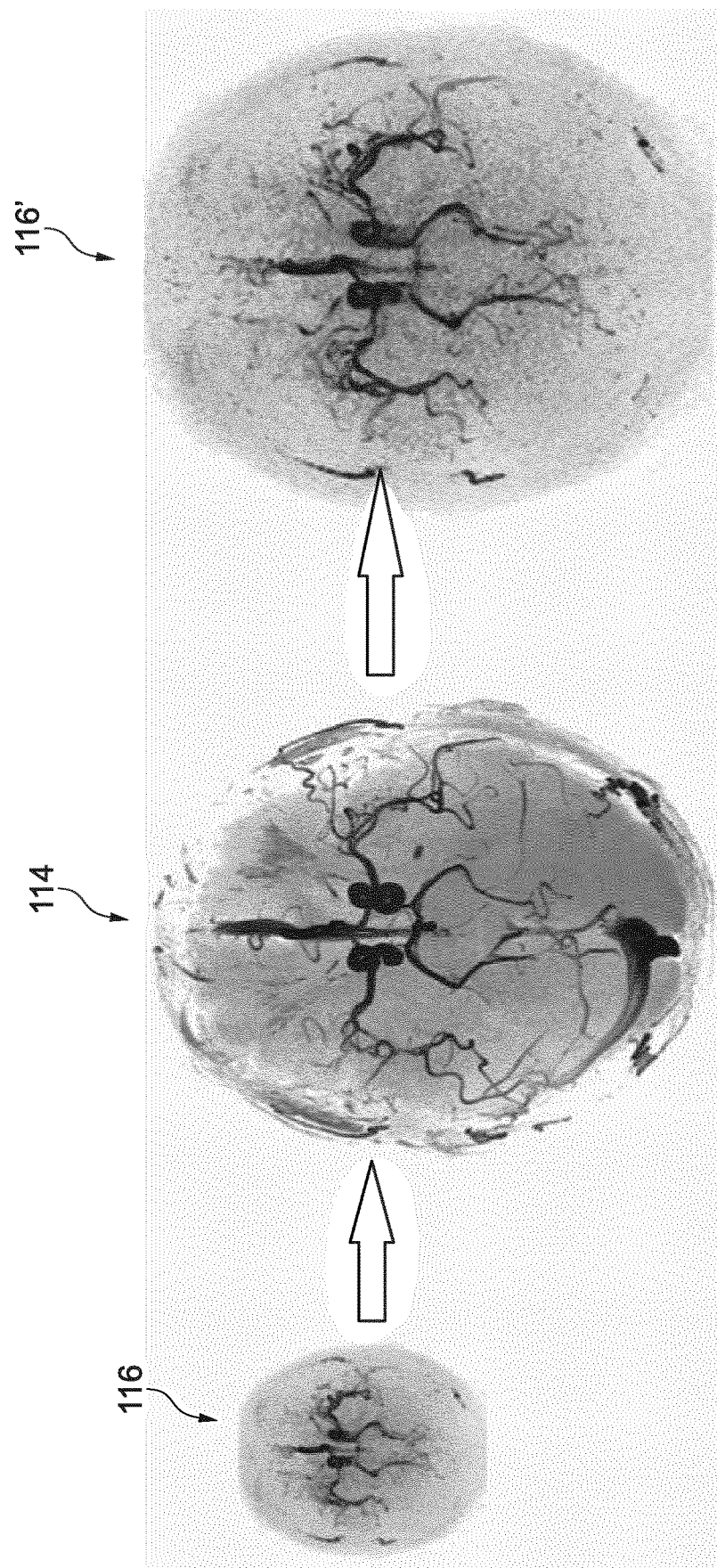
FIG. 5 shows an example of a static angiographic image and a times series of angiographic images.

FIG. 5 shows an example of a static angiographic image 114 and also shows one frame of a time series of angiographic images 116. In FIG. 5, and the following figures image 116 is intended to represent an entire time series of angiographic images, although only one image is shown. In FIG. 5, the static angiographic image 114 is a TOF angiographic image that is 512×512 voxels and makes up 170 slices. The time series of angiographic images 116 is 224× 224 voxels per slice and has only 120 slices. The ASL image 116 therefore has a lower resolution. Before performing the method the ASL image is resized into a resized time series angiographic image 116. The image is interpolated such that the resized image 116 now has 512×512 voxels per slice and also has 170 slices.

Figure 6:
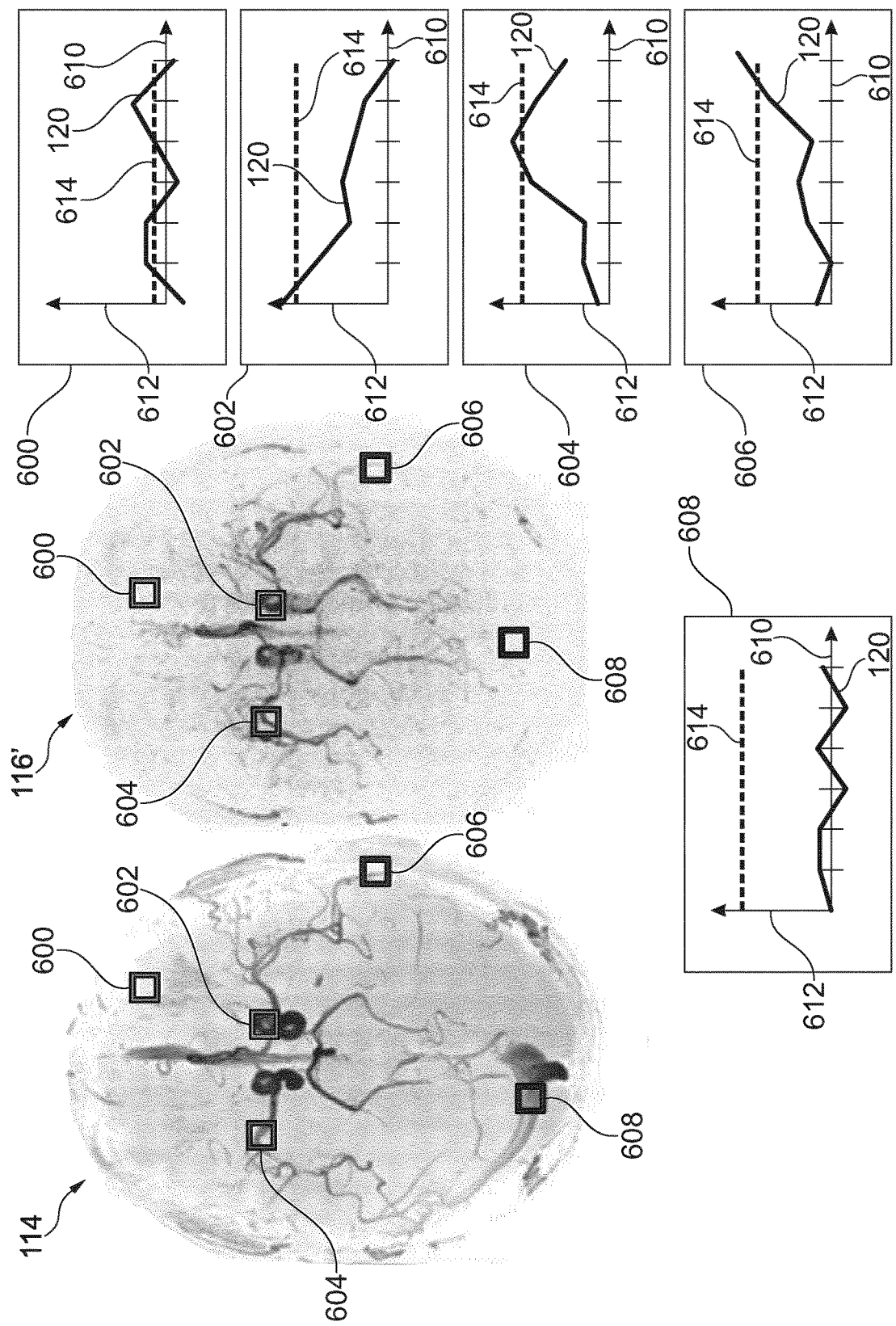
FIG. 6 shows examples of a time dependent signal derived from the static angiographic image and the times series of angiographic images of FIG. 5.

FIG. 6 shows a view of the static angiographic image 114 and the resized time series of angiographic images 116' from FIG. 5. It is used to illustrate the determination of the fill time. On both images 114 and 116' there are five boxes which indicate locations. This is region 1 600, region 2 602, region 3 604, region 4 606, and region 5 608. Each of the marked regions indicates a number of voxels. Adjacent to the images 114 and 116' are a number of plots that are labeled according to which region they represent. Each plot is a plot of time in terms of frames as a function of voxel signal or intensity 612. Within each plot is then the time dependent signal 120 and also is shown the predetermined threshold 614. Region 600 is outside of the mask and shows a noise signal. Region 602 shows a voxel or voxels which are filled early. Region 604 shows a region which is filled at a medium or middle time. Region 606 shows a voxel which is filled comparatively late. Box 608 shows a venous signal. For example box 608 is located within the mask and region 600 is not. FIG. 6 illustrates the signal evaluation in TOF and ASL images. For instance, this can be used to analyze flow behavior or draw conclusions on the type of artery. Mismatches may indicate pathological alterations of the vessels, but also technical issues (region 608). Detailed description of selected possibilities is given in the text above.

Figure 7:
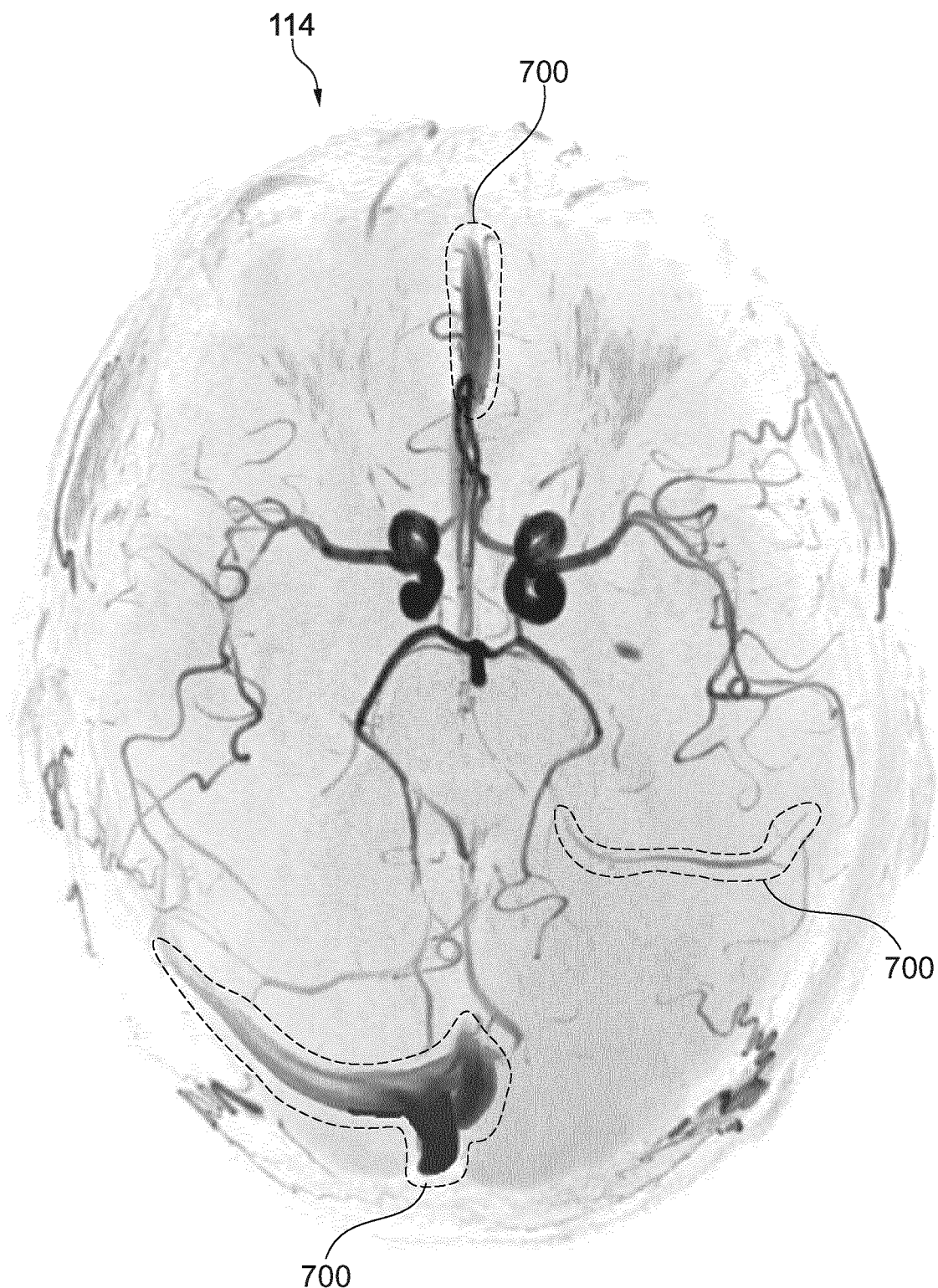
FIG. 7 shows the static angiographic image of FIG. 5 with marked regions.

FIG. 7 shows a further view of image 114. In FIG. 7 there are three regions which are surrounded by dashed lines and marked 700. These are marked regions 700. The marked regions show mismatches in the analysis of the images and when plotted may also be plotted and colored for emphasis. They may indicate pathological alterations of the vessels and/or technical issues during acquisition. In this example the visualization of venous vessels appears due to technical issues perhaps for insufficient saturation during acquisition of data. By this, the attention of the radiologist can be pinpointed to critical areas and may assist in overall diagnostic process or the adjustment of the acquisition of the images. Mismatches in the analysis of the images may be color-coded and can indicate pathological alterations of the vessels and technical issues. Here, the marked regions 700 indicate visualizations of venous vessels appeared due to technical issues (insufficient saturation). By this, the attention of the radiologist can be pinpointed to critical areas, supporting the overall diagnostic process.

Figure 8:
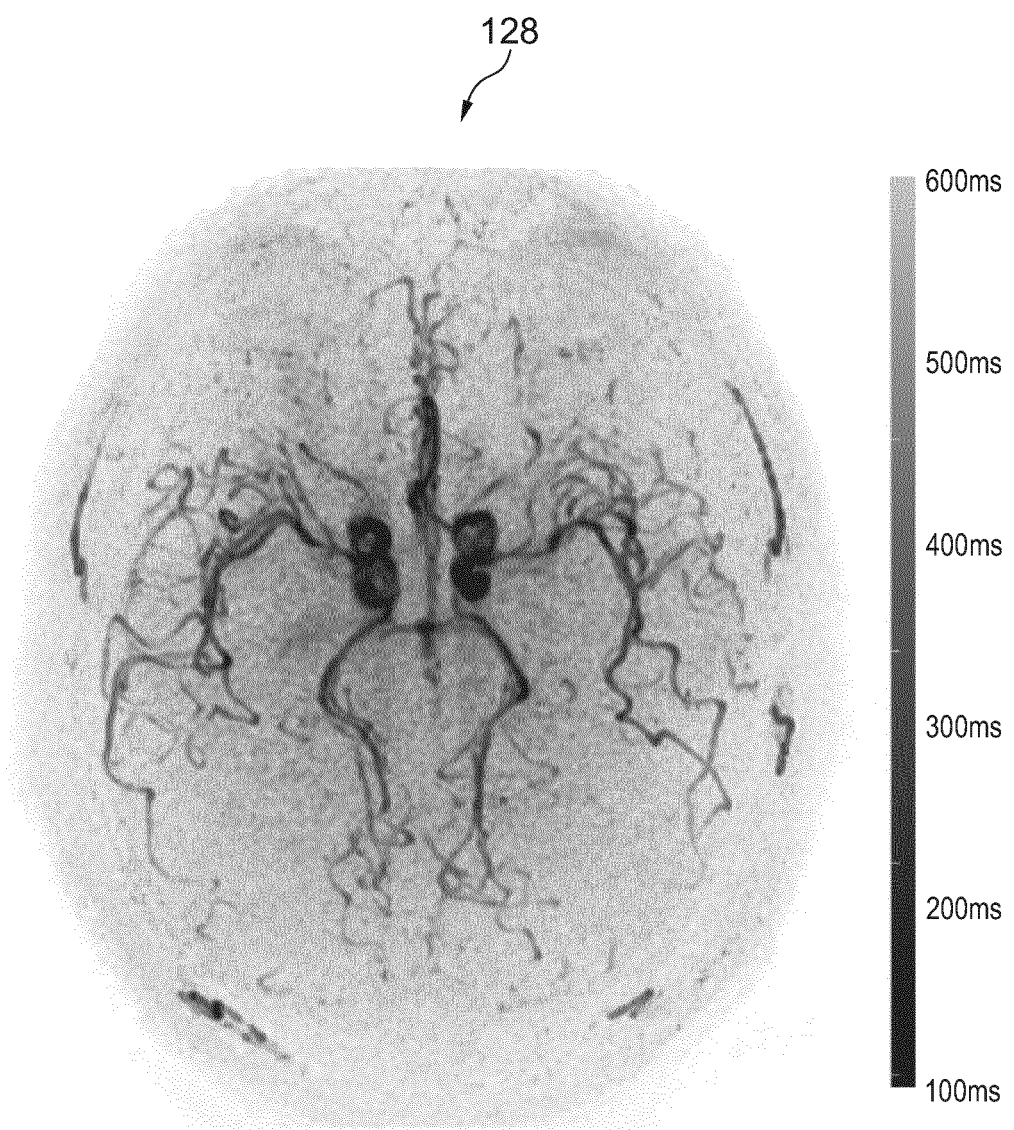
FIG. 8 shows an example of a composite angiographic image.

FIG. 8 shows an example of a composite angiographic image 128 that was constructed using the static angiographic image 114 and the time series of angiographic images 116' from FIGS. 5 and 6. In this example the composite angiographic image is a mapped TOF angiographic image with the temporal information from ASL presented as time of arrival map. Since ASL images only present arterial vessels, the presented image analysis can avoid visualization of venous vessels which may appear in QF images due to technical issues such as insufficient saturation as was indicated in FIG. 7. It is noted that the artifacts illustrated in FIG. 7 are not present in FIG. 8. FIG. 8 shows a mapped TOF image with the temporal information from ASL presented as a time-of-arrival map. Since ASL images only present arterial vessels, the presented image analysis can avoid the visualization of venous vessels which may appear in TOF images due to technical issues (insufficient saturation). This can be indicated as in FIG. 7.

FIRST EXAMPLE

1. The presented technique consists of two MRI sequences that are subsequently combined. A TOF scan with high spatial resolution of the vasculature is acquired and a time-resolved ASL angiography scan.

2. Image reformatting of the ASL images to match the same resolution and slice thickness as the TOF images, e.g. using bi-spline interpolation, bi-cubic image processing kernel, etc. (see FIG. 5).

3. Image registration of TOF and ASL data to counteract subject motion, e.g. with rigid registration or advanced transformation models.

4. Image analysis can be performed by creating a vessel mask from the TOF angiogram, e.g. by signal intensity thresholding or advanced segmentation methods.

5. The mask is being applied to the ASL images. In addition, temporal information in the ASL images is being used to evaluate the segmented vessels in the TOF images (mask), i.e. certain signal behavior in the ASL images is assessed voxel by voxel, e.g. signal behaviour over time (see FIG. 6).

6. In healthy people, both acquisitions should match, i.e. show signal where an artery is present. For the evaluation of the thereby obtained images several possibilities can occur, for instance:
  A. Background signal (Noise): In both images the signal level remains within the noise threshold. These voxels are therefore considered as background signal (see FIG. 6, region 600)
  B. Early Filling: ASL signal level appears high on in early temporal phases and then continuously decrease in following temporal phases. This indicates an early filled artery (see FIG. 6, region 602).
  C. Middle Filling: The ASL signal starts to increase after the first temporal phases and decreases towards late temporal phases (see FIG. 6, region 604).
  D. Late Filling: ASL signal is within noise threshold and starts to increase in later temporal phases. This indicates a late filling artery in the periphery (see FIG. 6, region 606).

7. Mismatches can occur due to technical but also pathological reasons. The appropriate voxels/area can be marked so that the radiologist can pay special attention (see FIG. 6). For instance:
  E. Venous signal: A vessel is visible in the TOF image. The signal of the ASL appears within noise level across all temporal phases. (See FIG. 6, region 608).
  F. Stenosis: Due to slow blood flow, a stenotic artery may not be visible on TOF images, but slow flow can be visualized with ASL angiography.
  G. Signal void: A vessel presents a signal void in the TOF image, e.g. due to in-plane flow direction, however, the artery is being visualized in the ASL images.

8. Visualization—The final images (time-resolved TOF with high spatial resolution) can also be visualized as either dynamic sequence or as time-of-arrival map, meaning that each temporal phase is assigned a different color to visualize inflow properties on a static image (see FIG. 8). For an automated evaluation of the vascular integrity, the output can be a probability map, meaning that areas of abnormal flow behavior are highlighted on the final images as described above (see FIG. 7).

SECOND EXAMPLE

As selective angiographic imaging (i.e. visualization of a single artery) is possible using ASL, the information from a single artery can be mapped on TOF images in a similar way.

THIRD EXAMPLE

The presented method can benefit from applications of machine learning algorithms to predict the possibility of abnormal flow behavior and/or an abnormal vascular situation. This could include using databases of normal vascular images as well as normal flow behavior. In further consequence, knowledge about specific behavior of pathologies would also increase confidence in these findings.

FOURTH EXAMPLE

The presented method is not limited to MR angiography methods only. The described image processing may also be applied to combine image information of two or more image sequences of MR and CT angiography data and other imaging modalities.

Examples may be applied to such applications as, but are not limited to: imaging cerebrovascular diseases with complex and diffuse flow patterns, for which not only high resolution information about the arteries is important, but also underlying hemodynamic properties. These can be stroke, arterio-venous malformations (AVM), but also fistulas, shunting arteries and tumor feeding arteries. Other applications include stenotic arteries, and occlusions.

Examples may not necessarily limited to the cerebral vasculature, but might also be used to visualize other arteries. These include visualization of the renal arteries, the coronary arteries, as well as the peripheral lower leg arteries.

An ASL angiography sequence may comprise two modules: the first module generates a bolus of labeled blood either by (pseudo-)continuously applying RF pulses or by applying a short RF pulse to a large volume proximal to the image region. The second module describes the image acquisition part of the sequence. The magnetization of the labeled blood decays rapidly and is too short to acquire all imaging data at once, thus, the whole process, i.e. the two modules, needs to be repeated until all image data is acquired. In addition, the same amount of data is acquired without blood labeling and which is subsequently used for image subtraction to correct the final angiography images of static tissue.

In TOF angiography, an image slice or volume is being saturated and data is acquired after unsaturated blood has entered the image stack.

It is possible, to perform a certain amount of TOF imaging, i.e. a subset of a single slice or image volume, in between ASL sequences that are repeated several times (see FIG. 9 below).

Figure 9:
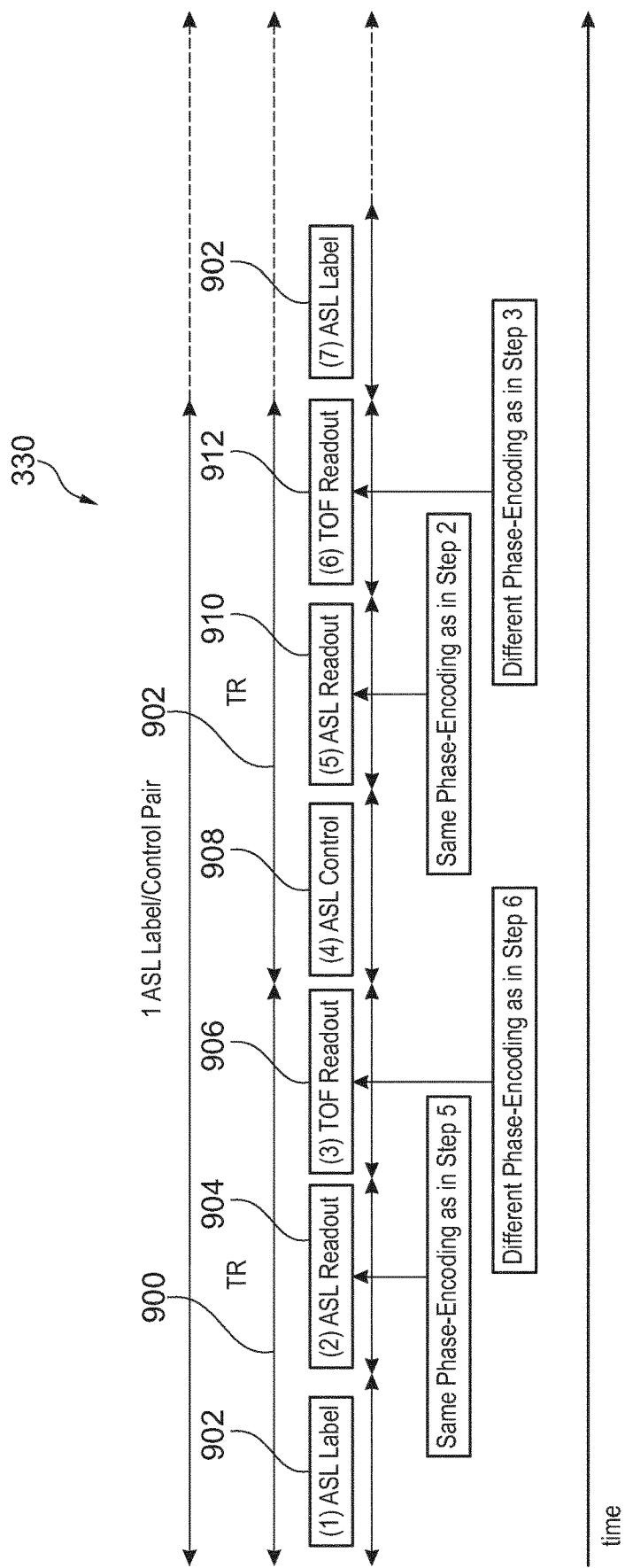
FIG. 9 illustrates an example of a interleaving scheme for constructing a combined ASL and TOF pulse sequence.

FIG. 9 illustrates a timing diagram for one implementation of the pulse sequence commands 330. In the example illustrated in FIG. 9 the pulse sequence commands acquire the TOF magnetic resonance data and the ASL magnetic resonance data using an interleaved pulse sequence. An alternative would be to acquire the complete TOF magnetic resonance data with one pulse sequence and then acquire the ASL magnetic resonance data with the second pulse sequence. The interleaved pulse sequence 330 comprises two blocks which alternate. There is a first repetition 900 and a second repetition 902. These two blocks repeat one after the other continuously until all of the data is acquired. In the first repetition 900 there is an ASL label 902, then an ASL readout is performed 904, and then finally a TOF readout 906. In the second repetition time 902 an ASL control 908 is performed first. Next an ASL readout 910 is performed followed by a TOF readout 912. The ASL readout 904 and 910 have the same phase encoding. The TOF readout 906 has a different phase encoding than the TOF readout 912.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
102 computer
104 hardware interface
106 processor
108 user interface
110 memory
112 machine executable instructions
114 static angiographic image
116 time series of angiographic images
116' resized time series of angiographic images
118 image mask
120 time dependent signal
122 calculated average from voxel
124 extremum of time dependent signal
126 fill time
128 composite angiographic image
200 receive a static angiographic image of a region of interest, wherein the region of interest comprises voxels
202 receive a time series of angiographic images of the region of interest
204 construct an image mask using the static angiographic image, wherein the image mask is an identification of voxels within the region of interest
206 determine a time dependent signal for each voxel within the image mask using the time series of angiographic images
208 construct a composite angiographic image
210 assigning a fill time to each voxel within the image mask using an extremum of the time dependent signal if the extremum deviates from the average of the time dependent signal more than a predetermined threshold
212 identifying voxels within the image mask as being unfilled voxels if the extremum deviates from the average of the time dependent signal less than a predetermined threshold
300 medical imaging system
302 magnetic resonance imaging system
304 magnet
306 bore of magnet
308 imaging zone
310 magnetic field gradient coils
312 magnetic field gradient coil power supply
314 radio-frequency coil
316 transceiver
318 subject
320 subject support
322 region of interest
324 tagging location
330 pulse sequence commands
332 TOF magnetic resonance data
334 ASL magnetic resonance data
400 control the magnetic resonance imaging system with the pulse sequence commands to acquire the TOF magnetic resonance data
402 control the magnetic resonance imaging system with the pulse sequence commands to acquire the ASL magnetic resonance data
404 provide the static angiographic image by reconstructing the static angiographic image from TOF magnetic resonance data
406 provide the time series of angiographic images by reconstructing the time series of angiographic images from ASL magnetic resonance data
600 region 1
602 region 2
604 region 3
606 region 4
608 region 5
610 time
612 voxel intensity
614 predetermined threshold
700 marked regions
900 first TR
902 second TR
902 ASL label
904 ALS readout
906 TOF readout
908 ASL control
910 ASL readout
912 TOF readout

The invention claimed is:

1. A medical imaging system comprising:
a memory storing machine executable instructions; and
a processor for controlling the medical imaging system, wherein execution of the machine executable instructions causes the processor to:
receive a static angiographic image of a region of interest, wherein the region of interest comprises voxels;
receive a time series of angiographic images of the region of interest;
construct an image mask using the static angiographic image, wherein the image mask is an identification of voxels within the region of interest;
determine a time dependent signal for each voxel within the image mask using the time series of angiographic images; and
construct a composite angiographic image by:
assigning a fill time to each voxel within the image mask using an extremum of the time dependent signal if the extremum deviates from an average of the time dependent signal more than a predetermined threshold; and
identifying voxels within the image mask as being unfilled voxels if the extremum deviates from the average of the time dependent signal less than the predetermined threshold; and
rendering the composite angiographic image such that a measure for the fill time is displayed in the composite angiographic image.

2. The medical imaging system of claim 1, wherein the static angiographic image is a Time-Of-Flight (TOF) magnetic resonance angiographic image, and wherein the time series of angiographic images is a time series of Arterial Spin Labeling magnetic resonance angiographic images.

3. The medical imaging system of claim 2, wherein execution of the machine executable instructions further cause the processor to:
provide the static angiographic image by reconstructing the static angiographic image from Time-Of-Flight magnetic resonance data; and
provide the time series of angiographic images by reconstructing the time series of angiographic images from Arterial Spin Labeling magnetic resonance data.

4. The medical imaging system of claim 3, wherein the medical imaging system further comprises a magnetic resonance imaging system, wherein the memory further comprises pulse sequence commands configured for controlling the magnetic resonance imaging system to acquiring the TOF magnetic resonance data according to a Time of Flight magnetic resonance angiography protocol, wherein the pulse sequence commands are further configured to control the magnetic resonance imaging system to acquire the ASL magnetic resonance data according to an Arterial Spin Labeling magnetic resonance angiography protocol, wherein execution of the machine executable instructions further cause the processor to:
control the magnetic resonance imaging system with the pulse sequence commands to acquire the TOF magnetic resonance data, and
control the magnetic resonance imaging system with the pulse sequence commands to acquire the ASL magnetic resonance data.

5. The medical imaging system of claim 4, wherein the Arterial Spin Labeling magnetic resonance angiography protocol is a selective Arterial Spin Labeling magnetic resonance angiography protocol.

6. The medical imaging system of claim 1, wherein any one of the following:
the static angiographic image is a magnetic resonance angiographic image or a CT angiographic image;
the time series of angiographic images are a time series of magnetic resonance angiographic images or a time series of CT angiographic images; and
combinations thereof.

7. The medical imaging system of claim 1, wherein execution of the machine executable instructions causes the processor to identify an anomalous flow and/or anomalous vascular structure using the composite angiographic image, the static angiographic image, and the time series of angiographic images as input to a trained pattern recognition algorithm.

8. The medical imaging system of claim 1, wherein the composite image is rendered one of the following ways:
the composite angiographic image is rendered as an animation showing filling of voxels within the image mask as a function of the fill time; and
the composite angiographic image is rendered as an image with a grey scale, a false color scale, or a brightness indicating the fill time of voxels within the image mask.

9. The medical imaging system of claim 1, wherein execution of the machine executable instructions further causes the processor to:
determine the time dependent signal for each voxel outside of the image mask using the time series of angiographic images; and
identify voxels outside of the image mask as anomalous voxels if the extremum of the time dependent signal deviates from the average of the time dependent signal more than the predetermined threshold.

10. The medical imaging system of claim 9, wherein execution of the machine executable instructions further causes the processor to mark the anomalous voxels in the composite angiographic image.

11. The medical imaging system of claim 1, wherein execution of the machine executable instructions further causes the processor to mark the unfilled voxels in the composite angiographic image.

12. The medical imaging system of claim 1, wherein execution of the machine executable instructions further causes the processor to perform any one of the following:
register the time series of angiographic images with one another;
register the static angiographic image with the time series of angiographic images; and
combinations thereof.

13. The medical imaging system of claim 1, wherein the static angiographic image divides the region of interest into a first set of voxels with a first resolution and a first slice thickness, wherein the time series of angiographic images divides the region of interest into a second set of voxels with a second resolution and a second slice thickness, and wherein execution of the machine executable instructions further causes the processor to interpolate one of the first set of voxels or the second set of voxels such that the first resolution matches the second resolution and the first slice thickness matches the second slice thickness.

14. A non-transitory computer readable medium comprising machine executable instructions for execution by a processor controlling a medical imaging system, wherein execution of the machine executable instructions causes the processor to:
receive a static angiographic image of a region of interest, wherein the region of interest comprises voxels;
receive a time series of angiographic images of the region of interest;

construct an image mask using the static angiographic image, wherein the image mask is an identification of voxels within the region of interest;

determine a time dependent signal for each voxel within the image mask using the time series of angiographic images; and construct a composite angiographic image by:

assigning a fill time to each voxel within the image mask using an extremum of the time dependent signal if the extremum deviates from an average of the time dependent signal more than a predetermined threshold; and identifying voxels within the image mask as being unfilled voxels if the extremum deviates from the average of the time dependent signal less than the predetermined threshold.

15. A method of medical imaging, wherein the method comprises:

receiving a static angiographic image of a region of interest, wherein the region of interest comprises voxels;

receiving a time series of angiographic images of the region of interest;

constructing an image mask using the static angiographic image, wherein the image mask is an identification of voxels within the region of interest;

determining a time dependent signal for each voxel within the image mask using the time series of angiographic images; and constructing a composite angiographic image by:

assigning a fill time to each voxel within the image mask using an extremum of the time dependent signal if the extremum deviates from an average of the time dependent signal more than a predetermined threshold; and identifying voxels within the image mask as being unfilled voxels if the extremum deviates from the average of the time dependent signal less than the predetermined threshold.

* * * * *